United States Patent [19]
Nguyen

[11] Patent Number: 5,942,910
[45] Date of Patent: Aug. 24, 1999

[54] METHOD AND CIRCUIT FOR PROVIDING ACCURATE VOLTAGE SENSING FOR A POWER TRANSISTOR, OR THE LIKE

[75] Inventor: Baoson Nguyen, Plano, Tex.

[73] Assignee: Texas Instruments Incorporated, Dallas, Tex.

[21] Appl. No.: 08/919,453

[22] Filed: Aug. 28, 1997

[51] Int. Cl.[6] .......................... G01R 31/26; H01L 23/58
[52] U.S. Cl. ............................ 324/769; 324/768; 438/18
[58] Field of Search ............................ 324/769, 765, 324/766, 767, 768, 763; 438/18, 268; 257/48

[56] References Cited

U.S. PATENT DOCUMENTS

| | | | |
|---|---|---|---|
| 5,663,574 | 9/1997 | Hierold et al. | 257/48 |
| 5,703,381 | 12/1997 | Iwasa et al. | 324/769 X |
| 5,838,164 | 11/1998 | Chen | 324/769 |

*Primary Examiner*—Josie Ballato
*Assistant Examiner*—T. R. Sundaram

*Attorney, Agent, or Firm*—W. James Brady III; Richard L. Donaldson

[57] ABSTRACT

A circuit (10) is disclosed for enabling voltage to be sensed across a power transistor (12) of the type which has first and second active regions, such as source (85) and drain (76) regions of an MOS transistor (12), or emitter and collector regions of a bipolar transistor (42), in a semiconductor substrate (72), with the first region (76) located along a first lateral extent in the substrate (72) to have ends at terminal locations (D1,S1) of the first lateral extent and the second region located along a second lateral extent in the substrate (72) to have ends at terminal locations (D2,S2) of the second lateral extent. The circuit (10) includes a first conductive line (20) connected to the first region at said terminal locations (D1,D2) of the first lateral extent, and a first voltage sensing connection (22) to a midpoint of the first conductive line (20). A second conductive line (28) is connected to the second region at the terminal locations (S1,S2) of the second lateral extent, and a second voltage sensing connection is made to a midpoint (34) of the second conductive line (28). The conductive lines (20,28) may be, for example, metal, polysilicon, or other suitable material.

18 Claims, 1 Drawing Sheet

METHOD AND CIRCUIT FOR PROVIDING ACCURATE VOLTAGE SENSING FOR A POWER TRANSISTOR, OR THE LIKE

BACKGROUND OF THE INVENTION

1. Field of the Invention

This invention relates to improvements in integrated circuits and integrated circuit techniques, and more particularly to improvements in methods and circuits for providing an accurate average voltage sensing for power transistors, or the like.

2. Relevant Background

Power transistors, particularly MOS power transistors used in integrated circuits, generally have source and drain active regions formed in a semiconductor substrate. Typically, for example, the source region may be an implanted or diffused region, usually having a generally rectangular shape when viewed from above, and a "U" cross sectional shape, when viewed from the side. The same is true for the drain region. The source and drain regions are separated by a channel region, with the current flow controlled therein by a potential applied to a gate located thereover, in a known manner.

Most power transistors operate to carry a high current, and in a linear region for MOS devices or in a saturation for bipolar devices. The voltage drop along the structures of big power devices causes a large difference in drain-source (or collector/emitter) voltage. When a sense transistor is used to sense a portion of the current of a power transistor, its drain-source voltage must be equal to the average drain-source voltage of the power device so an accurate current ratio can be achieved. This average point is hard to pinpoint exactly, because of many factors, such as the direction of current flow, variations in the width of metal interconnects or parts, locations of contact pads, variations in the amount of current conducted by each point on the metal interconnects, and son on.

What is needed, therefore is a circuit for enabling voltage, in general, and average voltage, in particular, to be accurately sensed across a power transistor and method for accomplishing same.

SUMMARY OF THE INVENTION

In light of the above, therefore, it is an object of the invention to provide a technique to sense the average $V_{DS}$ on a power transistor independent of pad locations and metal layout of the drain and source contacts.

This and other objects, features and advantages of the invention will be apparent to those skilled in the art from the following detailed description of the invention, when read in conjunction with the accompanying drawings and appended claims.

Thus, according to one aspect of the invention, two constant width metal lines respectively connect the furthest and the closest regions of the drain and the closest regions of the source of a MOS device, or, alternatively the closest regions of the collector and the closest regions of the emitter of a bipolar device. These metal lines each act as a resistor divider between the two extremes. If a power device is considered a number of parallel connected distributed devices, the metal lines are connected between the active elements of the first and last devices. The middle points of the metal lines therefore have the average voltage of the distributed drains and sources, or distributed collectors and emitters.

According to another broad aspect of the invention, a circuit for enabling voltage to be sensed across a power transistor is presented. The power transistor is of the type which has first and second active regions, such as source and drain regions for an MOS transistor and emitter and collector regions for a bipolar transistor. The active regions are formed in a semiconductor substrate, with the first active region located along a first lateral extent in the substrate to have ends at terminal locations of the first lateral extent and the second active region located along a second lateral extent in the substrate to have ends at terminal locations of the second lateral extent. The circuit includes a first conductive line connected to the first active region at the terminal locations of the first lateral extent, and a first voltage sensing connection is made to a midpoint of the first conductive line. A second conductive line is connected to the second active region at the terminal locations of the second lateral extent, and a second voltage sensing connection is made to a midpoint of the second conductive line. The conductive lines may be, for example, metal, polysilicon, or other suitable material.

According to another broad aspect of the invention, a circuit is provided for sensing a voltage across a power transistor which has first and second active regions in a semiconductor substrate, such as source and drain regions for an MOS transistor, or emitter and collector regions for a bipolar transistor. The first active region is located along a first lateral extent in the substrate to have ends at terminal locations of the first lateral extent. The second active region is located along a second lateral extent in the substrate to have drain ends at terminal locations of the second lateral extent. The circuit includes a first conductive line connected to the first active region at the terminal locations of the first lateral extent and a second conductive line connected to the second active region at the terminal locations of the second lateral extent. A voltage sensing circuit is connected between respective midpoints of the first and second conductive lines.

According to yet another broad aspect of the invention, a method is presented for sensing voltage across a power transistor which has first and second active regions in a semiconductor substrate, such as source and drain regions for an MOS transistor, or emitter and collector regions for a bipolar transistor. The power transistor is of the type in which the first active region is located along a first lateral extent in the substrate to have ends at terminal locations of the first lateral extent and the second active region is located along a second lateral extent in the substrate to have drain ends at terminal locations of the second lateral extent. The method includes providing a first conductive line connected to the first active region at the terminal locations of the first lateral extent, and providing a second conductive line connected to the second active region at the terminal locations of the second lateral extent. The method further includes sensing a voltage between a midpoint of the first conductive line and a midpoint of the second conductive line.

BRIEF DESCRIPTION OF THE DRAWING

The invention is illustrated in the accompanying drawing, in which.

In the various drawings, like reference numerals are used to denote like or similar parts. Additionally, the drawings are not necessarily drawn to scale.

DETAILED DESCRIPTION OF THE PREFERRED EMBODIMENTS

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

Figure 1:
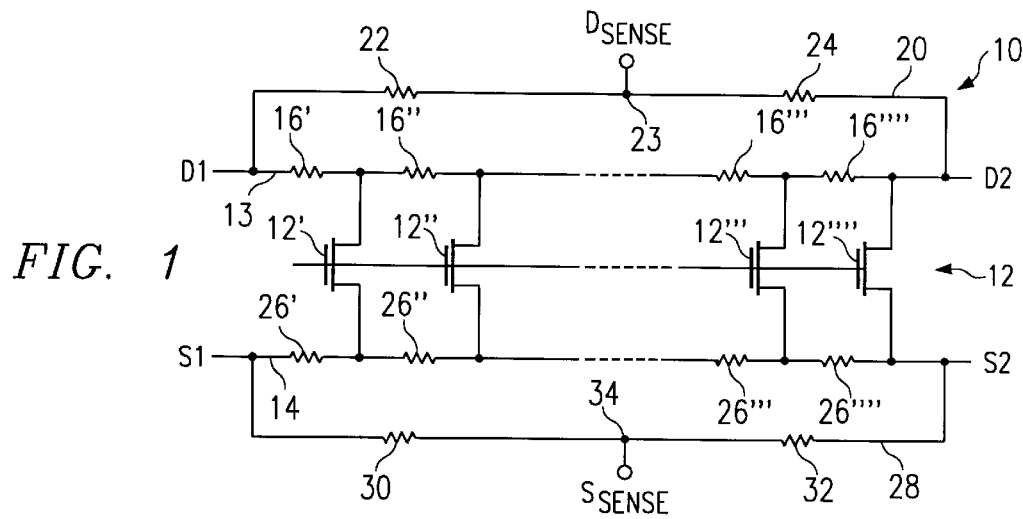
FIG. 1 is an electrical schematic diagram of an MOS power transistor model in which the MOS transistor is represented as a plurality of parallel connected MOS devices to which resistor voltage divider are connected, in accordance with a preferred embodiment of the invention.

With reference now to FIG. 1 of the drawing, a circuit 10 is shown in which a model of an MOS power transistor 12 is shown. The model is represented by an electrical schematic diagram in which the MOS power transistor 12 has its drain and source connected to respective lines 13 and 14, which in practice would be portions or regions of a semiconductor substrate. Typically it would be difficult to determine the average $\overline{VDS}$ of the power transistor 12, requiring one to know the exact metal layout and direction of current flow. Moreover, in the past, knowledge of the precise pad locations also necessary to locate the sense point at which the average $\overline{VDS}$ can be determined.

In the model shown, the MOS power transistor 12 is considered to be spatially distributed along a horizontal axis, as it may be physically constructed in a semiconductor substrate, and the MOS transistor 12 is represented in the model by a number of MOS transistors 12', 12", . . . 12''', 12'''', etc., connected in parallel.

Although the drain elements of each of the transistors 12'–12'''' are connected (and, in fact, are the same semiconductor region in the actual device), distributed resistances 16'–16'''' exist in the drain region, represented by line 13. Accordingly, from one physical end, D1, to the other, D2, an amount of resistance exists in the model. The total resistance, therefore, from end D1 to the other end D2 is therefore the sum of the individual resistances 16'–16'''' of the model 10.

As described above, in the past, in order to determine the average voltage of the drain of the MOS transistor 12, a connection was made directly to one point along the length of the drain line 13. Thus, the voltage may differ depending upon the precise physical location at which the connection is made.

In contrast, according to a preferred embodiment of the invention, a conductive line 20 is connected between the two physical extremities at D1 and D2 of the drain line 13. The conductive line 20 is of constant width between its ends at D1 and D2, and is of an appropriate conductive material, such as metal, preferably, or polysilicon, or other suitable material. The voltage sensing node 22 on which the voltage on the drain line 13 is sensed is located at the center of the conductive line 20. The conductive line 20 also has a distributed resistance along its length schematically denoted by resistors 22 and 24. Thus, through the use of the conductive line 20 with constant width, a resistor divider is provided between the ends D1 and D2. This allows an exact average $\overline{VDS}$ to be determined, independently of pads location and shape of the end metal. Thus, the voltage on node 22 on the conductive line 20 represents the average voltage across the physical length of the drain portion of the MOS transistor 12.

On the source side of the transistor 12, a similar arrangement is provided. More particularly, on the source line 14, a distributed resistance exists from one extremity, S1, to the other, S2. The distributed resistances are represented by resistors 26', 26", 12''' and 12''''. A conductive line 28, preferably of metal, polysilicon, or other conducting material is connected between the two extremities S1 and S2, having a distributed resistance along its length, represented by resistors 30 and 32. The conductive line 28 also is of constant width between its ends at S1 and S2. A connection is made at node 34 to the center portion of the conductor 28 at which the average voltage appearing upon the distributed source region of the transistor 12 can be measured.

Figure 2:
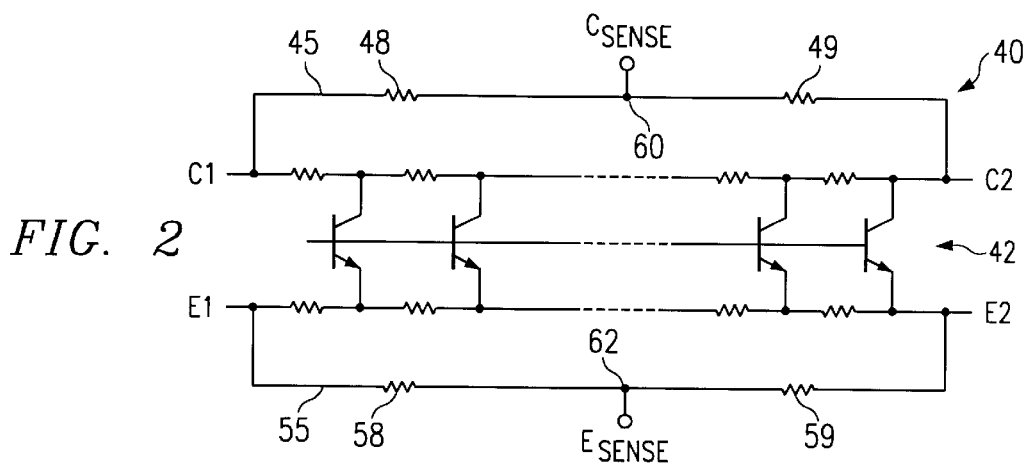
FIG. 2 is an electrical schematic diagram of a bipolar power transistor model in which an NPN transistor is represented as a plurality of parallel connected NPN devices to which resistor voltage dividers are connected, in accordance with a preferred embodiment of the invention.

A similar model 40 of a bipolar power transistor 42 is shown in FIG. 2. As shown, the connections to the power terminals, specifically the collector and emitter terminals of the NPN transistor 42 shown, are connected from each physical extremity of the respective terminals. More particularly, a conductor 45 of constant width is connected from one extremity C1 to the other C2 of the collectors of the transistor 42. The conductor 45 may be preferably of metal or other conducting materials such as polysilicon, or the like. The conductor 15 has a distributed resistance along its length, represented by the resistors 48 and 49 in the electrical schematic diagram of the model 40.

In a similar fashion, a conductor 55 is connected between the extremities E1 and E2 of the emitter of the NPN transistor 42. The conductor line 55 also may be of metal, polysilicon, or other conductive material, and includes a distributive resistance along its length, represented by resistors 58 and 59. Connections are made to the center parts of conductive lines 45 and 55 at respective nodes 60 and 62, whereby the average voltage existing along the physical line of the collector and emitter of the transistor 42 may be accurately sensed. It should be noted that although NPN transistors are shown, PNP transistors or other appropriate type of power device may be employed in conjunction with the averaging metal connecting lines of the invention.

Figure 3:
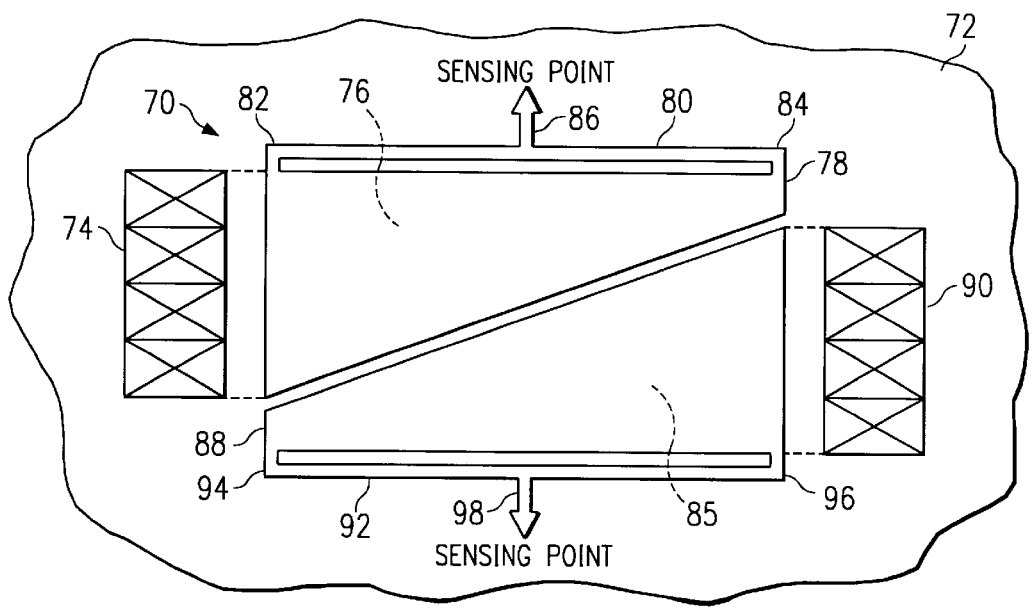
FIG. 3 is a top plan view of an integrated circuit structure in which a power transistor has been formed, including one embodiment of a metalization pattern for enabling the sensing of an average voltage across the active regions of the power transistor, in accordance with a preferred embodiment of the invention.

A physical embodiment of the interconnecting lines is shown in FIG. 3, in which a transistor 70, which may, for example, be an MOS, a bipolar, or other power transistor device, may be provided on a semiconductor substrate 72. In the embodiment illustrated, a MOS transistor is described, however, it will be understood that any type of power transistor may be employed. a number of bond pads 74 are provided by which connection can be made to the source 76 of the MOS transistor 70. An overlying metal connection 78 is provided contacting the entire source region of the transistor.

A conductive line 80 is provided, connected at ends 82 and 84 of the source connector plate 78, having a sensing point at its central location or node 86. Thus, with respect to ground or potential of the substrate 72, the voltage appearing at node 86 of the conductive line 80 will represent the average voltage that is seen across the physical length of the source region 76 of the MOS transistor 70.

Similarly, the drain region 85 of the MOS transistor has an overlying plate 88 of metal or other conducting material in contact with its entire physical extent. A number of bond pads 90 are provided by which connection is made to the drain region 85. a conductive line 92 is provided that is connected at each respective end 94 and 96 of the plate 88. a connection is made to the center or central location or node 98 of the conductive line 92 at which appears the average voltage of the drain region 85 contacted by the plate 88 with respect to the potential of the substrate 72.

Thus, by virtue of the connections respectively made to the source region 76 by the bond pad 74 and to the drain region 85 by the bond pads 90, the average voltage of the respective source region 76 and drain region 85 may be respectively sensed. It can therefore be seen that in contrast to most application of power transistors in which the device operates in the mean region, through the use of the present invention, any difference in $V_{DS}$ or $V_{CE}$ of the power transistor versus the sense transistor will cause the same percentage error in sense current. For accurate current sensing using sense transistors, the technique of the invention provides an average $\overline{VDS}$ (or $\overline{VCE}$) of the power transistor so that the sense transistor $V_{DS}$ can be forced to it with other active circuitry.

Another of the advantages of the solution provided by the invention is that it provides an accurate average drain-source (or collector-emitter) voltage with almost no added cost, and with no extra components. The accuracy is virtually independent of the locations of the contact pads, the direction of current flow, and the metal layout of the power transistor.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A circuit for enabling voltage to be sensed across a power transistor having first and second active regions in a semiconductor substrate, said first active region being located along a first lateral extent in said substrate to have ends at terminal locations of said first lateral extent and said second active region being located along a second lateral extent in said substrate to have drain ends at terminal locations of said second lateral extent, comprising:
    a first conductive line connected to said first active region at said terminal locations of said first lateral extent;
    a first voltage sensing connection at a midpoint of said first conductive line;
    a second conductive line connected to said second active region at said terminal locations of said second lateral extent;
    a second voltage sensing connection at a midpoint of said second conductive line.

2. The circuit of claim 1 wherein said first and second conductive lines are metal lines.

3. The circuit of claim 2 wherein said first and second conductive lines are located on a surface of said substrate.

4. The circuit of claim 1 wherein said first and second conductive lines extend adjacent said respective first and second active regions.

5. The circuit of claim 1 wherein said first and second active regions are respectively source and drain regions of an MOS transistor.

6. The circuit of claim 1 wherein said first and second active regions are respectively emitter and collector regions of a bipolar transistor.

7. A circuit for sensing a voltage across a power transistor having a first and second active regions in a semiconductor substrate, said first active region being located along a first lateral extent in said substrate to have ends at terminal locations of said first lateral extent and said second active region being located along a second lateral extent in said substrate to have drain ends at terminal locations of said second lateral extent, comprising:
    a first conductive line connected to said first active region at said terminal locations of said first lateral extent;
    a second conductive line connected to said second active region at said terminal locations of said second lateral extent;
    a voltage sensing circuit connected between respective midpoints of said first and second conductive lines.

8. The circuit of claim 5 wherein said first and second conductive lines are metal lines.

9. The circuit of claim 6 wherein said first and second conductive lines are located on a surface of said substrate.

10. The circuit of claim 5 wherein said first and second conductive lines extend adjacent said respective first and second active regions.

11. The circuit of claim 5 wherein said first and second active regions are respectively source and drain regions of an MOS transistor.

12. The circuit of claim 5 wherein said first and second active regions are respectively emitter and collector regions of a bipolar transistor.

13. A method for sensing voltage across a power transistor having first and second active regions in a semiconductor substrate, said first active region being located along a first lateral extent in said substrate to have ends at terminal locations of said first lateral extent and said second active region being located along a second lateral extent in said substrate to have ends at terminal locations of said second lateral extent, comprising:
    providing a first conductive line connected to said first active region at said terminal locations of said first lateral extent;
    providing a second conductive line connected to said second active region at said terminal locations of said second lateral extent;
    sensing a voltage between a midpoint of said first conductive line and a midpoint of said second conductive line.

14. The method of claim 9 wherein said steps of providing first and second conductive lines comprises providing first and metal lines.

15. The method of claim 10 wherein said steps of providing first and second conductive lines comprises locating said first and second conductive lines on a surface of said substrate.

16. The method of claim 9 wherein said step of providing first and second conductive lines comprises establishing said first and second conductive lines at locations adjacent respective ones of said first and second active regions.

17. The method of claim 9 wherein said step of providing a first conductive line connected to said first active region at said terminal locations of said first lateral extent comprises connecting a conductive line to a source region of an MOS power transistor, and wherein said step of providing a second conductive line connected to said second active region at said terminal locations of said second lateral extent comprises connecting a conductive line to a drain region of said MOS power transistor.

18. The method of claim 9 wherein said step of providing a first conductive line connected to said first active region at said terminal locations of said first lateral extent comprises connecting a conductive line to an emitter region of a bipolar power transistor, and wherein said step of providing a second conductive line connected to said second active region at said terminal locations of said second lateral extent comprises connecting a conductive line connected to a collector region of said bipolar power transistor.

* * * * *